(12) United States Patent
Jeon et al.

(10) Patent No.: US 8,680,605 B2
(45) Date of Patent: Mar. 25, 2014

(54) STACKED MEMORY DEVICES AND METHOD OF MANUFACTURING THE SAME

(75) Inventors: Sang-hun Jeon, Yongin-si (KR); Ho-jung Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 475 days.

(21) Appl. No.: 13/112,443

(22) Filed: May 20, 2011

(65) Prior Publication Data

US 2011/0286275 A1  Nov. 24, 2011

(30) Foreign Application Priority Data

May 24, 2010  (KR) ........................ 10-2010-0048187

(51) Int. Cl.
*H01L 29/792* (2006.01)
*H01L 21/336* (2006.01)
*G11C 16/04* (2006.01)

(52) U.S. Cl.
USPC ........... 257/324; 257/314; 257/315; 257/316; 257/777; 257/E29.262; 257/E27.103; 257/E29.309; 365/185.17; 438/268

(58) Field of Classification Search
USPC .......... 257/314–316, 324, 326, 777, E21.423, 257/E27.103, E29.262, E29.309; 365/185.05, 185.17, 185.11, 185.12; 438/257, 261, 266, 268
See application file for complete search history.

(56) References Cited

U.S. PATENT DOCUMENTS

| | | | |
|---|---|---|---|
| 5,991,224 A | 11/1999 | Aipperspach et al. | |
| 7,936,004 B2 * | 5/2011 | Kito et al. | 257/324 |
| 8,288,816 B2 * | 10/2012 | Komori et al. | 257/324 |
| 8,372,720 B2 * | 2/2013 | Fukuzumi et al. | 438/287 |
| 8,395,206 B2 * | 3/2013 | Lee et al. | 257/324 |
| 8,482,049 B2 * | 7/2013 | Son et al. | 257/314 |
| 8,547,719 B2 * | 10/2013 | Park et al. | 365/51 |
| 2008/0310220 A1 * | 12/2008 | Tan et al. | 365/182 |

FOREIGN PATENT DOCUMENTS

| | | |
|---|---|---|
| JP | 2009224612 A | 10/2009 |
| JP | 2009238871 A | 10/2009 |
| KR | 1020070071611 A | 7/2007 |
| KR | 1020090105734 A | 10/2009 |
| KR | 100935936 | 1/2010 |

* cited by examiner

*Primary Examiner* — Allison P Bernstein
(74) *Attorney, Agent, or Firm* — Harness, Dickey & Pierce, P.L.C.

(57) ABSTRACT

A stacked memory device may include at least one memory unit and at least one peripheral circuit unit arranged either above or below the at least one memory unit. The at least one memory unit may include a memory string array, a plurality of bit lines, and a plurality of string selection pads. The memory string may include a plurality of memory strings arranged in a matrix and each of the memory strings may include a plurality of memory cells and a string selection device arranged perpendicular to a substrate. The plurality of bit lines may extend in a first direction and may be connected to ends of the plurality of memory strings. The plurality of string selection pads may be arrayed in a single line along the first direction and may be connected to the string selection devices included in the plurality of memory strings.

20 Claims, 17 Drawing Sheets

STACKED MEMORY DEVICES AND METHOD OF MANUFACTURING THE SAME

CROSS-REFERENCE TO RELATED APPLICATIONS

This application claims priority under 35 U.S.C. §119 to Korean Patent Application No. 10-2010-0048187, filed on May 24, 2010, in the Korean Intellectual Property Office (KIPO), the entire contents of which are herein incorporated by reference.

BACKGROUND

1. Field

Example embodiments relate to a semiconductor device, and more particularly, to a stacked memory device and method of manufacturing the same.

2. Description of the Related Art

There is an increasing demand for electronic devices to have a relatively small size and to process relatively large amounts of data. Accordingly, the integration of a semiconductor memory device used in the electronic devices needs to be improved.

SUMMARY

Provided is a stacked memory device and a method of manufacturing the same, whereby the integrity of a memory device may be increased by stacking peripheral circuits above or below a memory, and a line connection between the memory and the peripheral circuits may be simplified.

Additional aspects will be set forth in part in the description which follows and, in part, will be apparent from the description, or may be learned by practice of example embodiments.

In accordance with example embodiments, a stacked memory device may include at least one memory unit and at least one peripheral circuit unit arranged at least one of above and below the at least one memory unit. In example embodiments, the at least one memory unit may include a memory string array, a plurality of bit lines, and a plurality of string selection pads. The memory string may include a plurality of memory strings arranged in a matrix and each of the memory strings may include a plurality of memory cells and a string selection device arranged perpendicular to a substrate. The plurality of bit lines may extend in a first direction and may be connected to ends of the plurality of memory strings. The plurality of string selection pads may be arrayed in a single line along the first direction and may be connected to the string selection devices included in the plurality of memory strings.

In accordance with example embodiments, a method of manufacturing a stacked memory device may include forming a plurality of string selection gate electrodes and a plurality of control gate electrodes extending in a first direction on a substrate, forming a plurality of semiconductor pillars penetrating the plurality of string selection gate electrodes and the plurality of control gate electrodes, forming a plurality of bit lines connected to ends of the plurality of semiconductor pillars and extending in a second direction perpendicular to the first direction, forming a plurality of string selection pads in a single line along the second direction, the plurality of string selection pads being connected to ends of the plurality of string selection gate electrodes, and forming peripheral circuit devices above a portion of the plurality of bit lines and the plurality of string selection pads.

In accordance with example embodiments, a stacked memory device may include at least one memory unit and at least one peripheral circuit unit formed above or below the at least one memory unit, wherein the at least one memory unit includes a memory string array comprising a plurality of memory strings formed to be perpendicular to a substrate, and matrix-arrayed, wherein each of the plurality of memory strings comprises a plurality of memory cells and a string selection device. In example embodiments a plurality of bit lines may be connected to ends of the plurality of memory strings, respectively, and the plurality of bit lines may extend in a first direction. In example embodiments, a plurality of string selection pads may be connected to string selection devices comprised in the plurality of memory strings, and arrayed in a single line along the first direction.

In example embodiments, string selection devices included in the memory strings, which are adjacent to each other in the first direction and are from among the plurality of memory strings, may be connected to different string selection pads from among the plurality of string selection pads, and string selection devices included in the memory strings, which are adjacent to each other in a second direction perpendicular to the first direction and are from among the plurality of memory strings, may be commonly connected to one of the plurality of string selection pads. Also, ends of memory strings, which are adjacent to each other in the first direction and are from among the plurality of memory strings, may be commonly connected to one of the plurality of bit lines and ends of memory strings, which are adjacent to each other in a second direction perpendicular to the first direction and are from among the plurality of memory strings, may be connected to different bit lines from among the plurality of bit lines.

The at least one memory unit may further include a plurality of word lines connected to the plurality of memory cells, respectively, and extending in the first direction. The memory string array may include a plurality of semiconductor pillars formed to be perpendicular to the substrate, a plurality of storage mediums formed at sidewalls of the plurality of semiconductor pillars, respectively, and a plurality of gate electrodes stacked above the substrate in a direction parallel to the substrate so as to cross the plurality of semiconductor pillars, and extending in a second direction perpendicular to the first direction.

The plurality of gate electrodes may include string selection gate electrodes connected to the string selection devices comprised of the plurality of memory strings and control gate electrodes connected to the plurality of memory cells comprised of the plurality of memory strings. In example embodiments, the stacked memory device may further include a plurality of first contact plugs formed on ends of the string selection gate electrodes, respectively, and connecting the plurality of string selection pads to the string selection gate electrodes, respectively. The stacked memory device may further include a plurality of second contact plugs formed on ends of the control gate electrodes, respectively, and connecting the plurality of word lines to the control gate electrodes, respectively.

In example embodiments, control gate electrodes, which are disposed at a same level and are from among the control gate electrodes, may be commonly connected to one of the plurality of word lines, and control gate electrodes, which are disposed at different levels and are from among the control gate electrodes, may be connected to different word lines from among the plurality of word lines.

Each of the plurality of memory strings may further include a ground selection device, and the plurality of gate electrodes may further include ground selection gate electrodes connected to the ground selection devices comprised in the plurality of memory strings. The at least one memory unit may further include a ground selection line connected to the ground selection devices, and extending in the first direction. The at least one memory unit may further include a plurality of third contact plugs formed on ends of the ground selection gate electrodes, respectively, and connecting the ground selection line to the ground selection gate electrodes, respectively. The at least one memory unit may further include a common source line formed between the substrate and the plurality of memory strings, so as to be connected to the plurality of memory strings according to a signal applied to the ground selection line, and extending in the second direction.

Ends of the plurality of gate electrodes may be step-shaped.

The plurality of memory strings may include a plurality of NAND flash memory strings, and the plurality of memory cells may include a plurality of NAND flash memory cells.

At least one peripheral circuit unit may include at least one of a first circuit unit disposed above a portion of the plurality of bit lines, a second circuit unit disposed above a portion of the plurality of string selection pads, and a third circuit unit disposed above a portion of the plurality of word lines. The first circuit unit may include at least one of a column decoder, a write driver, a sense amplifier, and a page buffer, the second circuit unit may include at least one of a string selection driver and a string selection decoder, and the third circuit unit may include at least one of a row driver and a row decoder.

The at least one memory unit may include a plurality of memory units stacked on the substrate, and the at least one peripheral circuit unit may include a plurality of peripheral circuit units alternately stacked with the plurality of memory units.

In accordance with example embodiments, a method of manufacturing a stacked memory device may include the operations of forming a plurality of string selection gate electrodes and a plurality of control gate electrodes extending in a first direction on a substrate, forming a plurality of semiconductor pillars penetrating the plurality of string selection gate electrodes and the plurality of control gate electrodes, forming a plurality of bit lines connected to ends of the plurality of semiconductor pillars, respectively, and extending in a second direction perpendicular to the first direction, forming a plurality of string selection pads in a single line along the second direction, wherein the plurality of string selection pads are connected to ends of the plurality of string selection gate electrodes, and forming peripheral circuit devices above a portion of the plurality of bit lines and the plurality of string selection pads.

The method may further include the operations of forming a plurality of word lines connected to ends of the plurality of control gate electrodes, and extending in the second direction.

The method may further include the operation of forming storage mediums at sidewalls of the plurality of semiconductor pillars.

BRIEF DESCRIPTION OF THE DRAWINGS

Example embodiments will be readily appreciated from the following description, taken in conjunction with the accompanying drawings of which.

DETAILED DESCRIPTION

Figure 1:
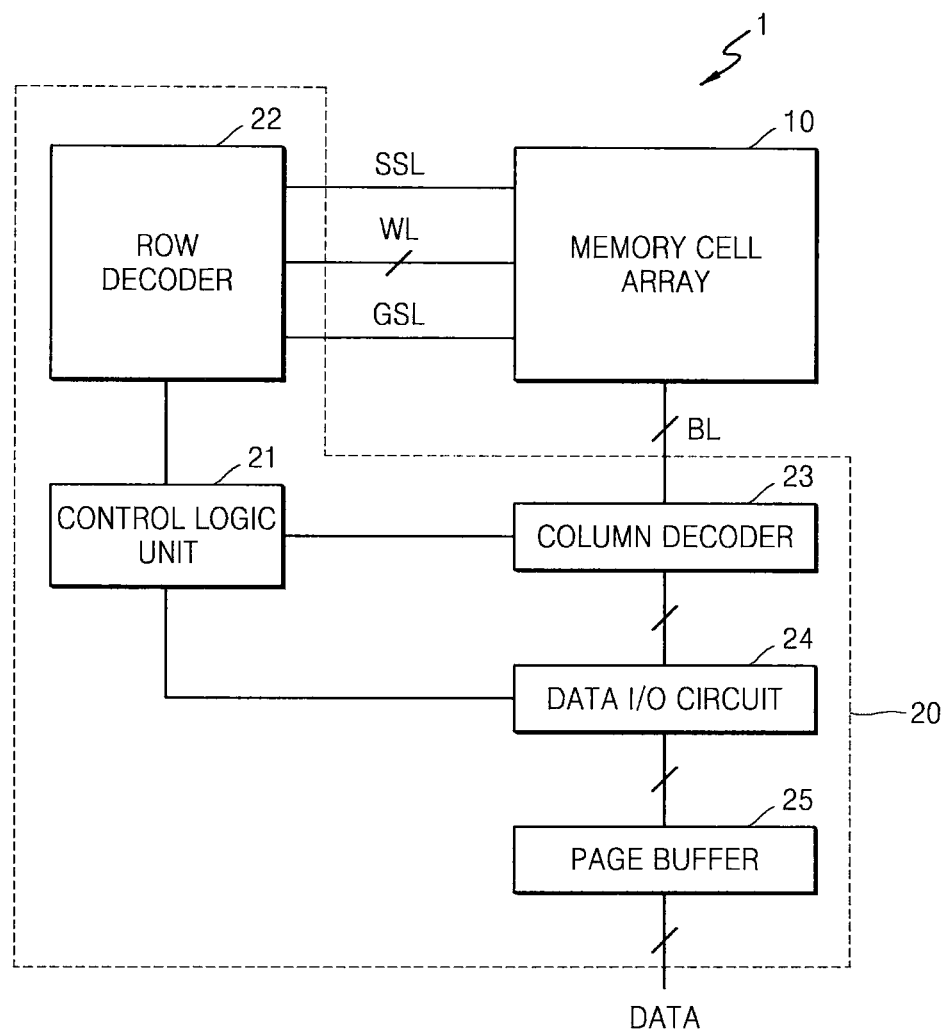
FIG. 1 is a block diagram of a memory device according to example embodiments.

Reference will now be made in detail to example embodiments, examples of which are illustrated in the accompanying drawings, wherein like reference numerals refer to the like elements throughout, and the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to example embodiments which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the present description. In the drawings, configuring elements may be exaggerated for convenience of the description.

Also, terms or words used in the following description may have common or general meanings in the art. For example, the term "at least one" means one or more, and thus may indicate a singular form or plural forms.

As used herein, the term "and/or" includes any and all combinations of one or more of the associated listed items.

FIG. 1 is a block diagram of a memory device 1 according to example embodiments.

Referring to FIG. 1, the memory device 1 may include a memory cell array 10 and a peripheral circuit 20. The peripheral circuit 20 may include a control logic unit 21, a row decoder 22, a column decoder 23, a data input/output (I/O) circuit 24, and a page buffer 25. Although not illustrated in FIG. 1, the peripheral circuit 20 may further include a row driver or a column driver.

The memory cell array 10 may include a plurality of memory blocks, and each of the plurality of memory blocks may include a plurality of memory cells. In example embodiments, the memory cell array 10 may include a plurality of memory strings, and each of the plurality of memory strings may include a plurality of flash memory cells. However, example embodiments are not limited thereto. In example embodiments, the plurality of memory cells that may be included in the memory cell array 10 may be magnetoresistive random access memories (MRAMs), parameter random access memories (PRAMs), resistive random access memories (RRAM), ferroelectric random access memories (FeRAM), dynamic random access memories (DRAMs), or static random access memories (SRAMs).

In example embodiments, the control logic unit 21 may communicate with the row decoder 22, the column decoder 23, and/or the data I/O circuit 24. In more detail, the control logic unit 21 may generate a plurality of signals based on an externally-received address and/or command, and may deliver the plurality of signals to the row decoder 22, the column decoder 23, and/or the data I/O circuit 24. For example, the control logic 21 may deliver a row address signal to the row decoder 22, a column address signal to the column decoder 23, and control signals to the data I/O circuit 24.

The row decoder 22 may electrically connect a string selection line SSL, word lines WL, and/or a ground selection line GSL to the memory cell array 10, in response to the row address signal. In more detail, the row decoder 22 may include a string selection line decoder, a word line decoder and/or a ground selection line decoder. Also, the column decoder 23 may be electrically connected to the memory cell array 10 via bit lines BL, in response to the column address signal.

The data I/O circuit 24 may include a write driver and/or a sense amplifier, and thus may write data to the memory cell array 10 or may read data from the memory cell array 10. In more detail, when a write operation is performed, the write driver may provide a program current (or a write current) to a selected memory cell. When a read operation is performed, the sense amplifier may provide a read current to a selected memory cell, may compare a voltage of a sensing line with a reference voltage, and then may read data stored in the selected memory cell. The page buffer 25 may provide externally-input data to the write driver, or may externally output data that is read by the sense amplifier.

Figure 2:
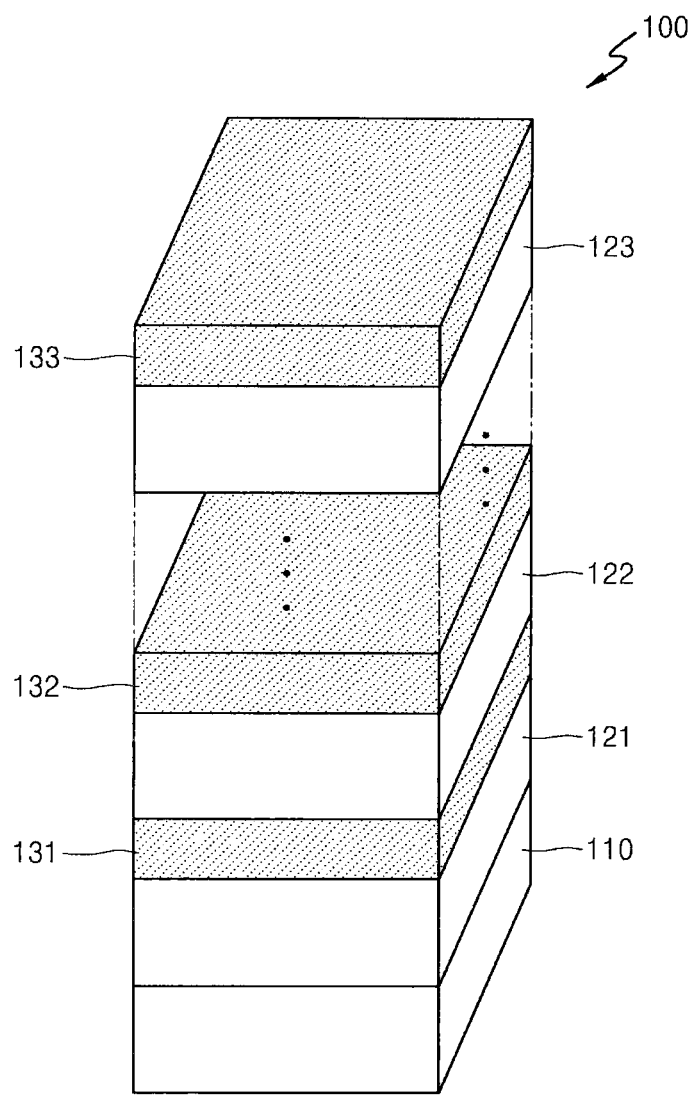
FIG. 2 is a perspective view of a stacked memory device according to example embodiments.

FIG. 2 is a perspective view of a stacked memory device 100 according to example embodiments.

Referring to FIG. 2, the stacked memory device 100 may include a substrate 110, a plurality of memory units 121, 122, and 123, and a plurality of peripheral circuit units 131, 132, and 133. In example embodiments, the number of memory units and/or peripheral circuit units, which may be stacked above the substrate 110, may vary.

The substrate 110 may be a semiconductor substrate. For example, the semiconductor substrate may include one selected from the group consisting of silicon, silicon-on-insulator, silicon-on-sapphire, germanium, silicon-germanium, and gallium-arsenide. Also, the substrate 110 may be provided as a bulk wafer or an epitaxial layer.

The plurality of memory units 121, 122, and 123 may be stacked on the substrate 110, and the plurality of peripheral circuit units 131, 132, and 133 and the plurality of memory units 121, 122, and 123 may be alternately stacked. In example embodiments, the plurality of memory units 121, 122, and 123 may correspond to the memory cell array 10 in FIG. 1, and the plurality of peripheral circuit units 131, 132, and 133 may correspond to the peripheral circuit 20 in FIG. 1. In example embodiments, the plurality of peripheral circuit units 131, 132, and 133 may be referred to as an active circuit unit or a core circuit unit.

In example embodiments, each of the plurality of memory units 121, 122, and 123 may include a plurality of memory layers, and each of the plurality of memory layers may be divided into at least two groups. For example, each memory layer may be divided into a first group including odd memory strings, and a second group including even memory strings. Also, each of the plurality of peripheral circuit units 131, 132, and 133 disposed above each of the plurality of memory units 121, 122, and 123 may be connected to first groups included in the plurality of memory layers, and each of the plurality of peripheral circuit units 131, 132, and 133 disposed below each of the plurality of memory units 121, 122, and 123 may be connected to second groups included in the plurality of memory layers.

Although not illustrated in FIG. 2, the stacked memory device 100 may further include a bottom active circuit unit. The bottom active circuit unit may be formed above the substrate 110 and below the memory unit 121, may be connected to the plurality of peripheral circuit units 131, 132, and 133, and may provide control signals to the plurality of peripheral circuit units 131, 132, and 133. In example embodiments, the bottom active circuit unit may include an I/O driver and/or a row driver. In example embodiments, the I/O driver may provide Y-address signals of memory cells included in the plurality of memory units 121, 122, and 123, and the row driver may provide X-address signals of memory cells included in the plurality of memory units 121, 122, and 123. In addition, the bottom active circuit unit may further include other circuits for a buffering or amplifying operation of a signal.

In a memory device according to the related art, a memory unit and a peripheral circuit unit are formed on a substrate. In more detail, the peripheral circuit unit is formed at a side of the memory unit. Thus, in order to connect a string selection transistor, memory cells, and a ground selection transistor, which are included in the memory unit, to a row driver or a row decoder which is included in the peripheral circuit unit, it is necessary to form a string selection line, word lines, bit lines, and a ground selection line extending in a direction toward the peripheral circuit unit, for example, in a horizontal direction. Accordingly, it is necessary for the memory unit to have an area in which memory strings are formed, and an area in which the string selection line, the word lines, and the ground selection line extend. By doing so, there is a limit in improving the integrity of the memory device.

However, in the stacked memory device 100 according to example embodiments, each of the plurality of peripheral circuit units 131, 132, and 133 is formed above or below each of the plurality of memory units 121, 122, and 123. For example, in the case where the peripheral circuit unit 131 is formed above the memory unit 121, a row driver or a row decoder may be disposed immediately above a string selection transistor, memory cells, and a ground selection transistor. Thus, it is not necessary to form a string selection line, word lines, and a ground selection line extending in a direction toward the peripheral circuit 131, for example, in a horizontal direction, so that the integrity of the stacked memory device 100 may be significantly increased. Also, since the peripheral circuit unit 131 may be formed immediately above the memory unit 121, the complexity of a line connection between the memory unit 121 and the peripheral circuit unit 131 may be significantly decreased. In addition, the lengths of lines between the memory unit 121 and the peripheral circuit unit 131 may be reduced.

In example embodiments, active regions in the plurality of peripheral circuit units 131, 132, and 133 may include at least one of zinc oxide (ZnO)-based materials including ZnO, indium zinc oxides (InZnO), indium zinc gallium oxide (InZnGaO) or the like. The ZnO-based materials may be deposited at room temperature of about 25□, and do not have a grain boundary due to an amorphous structure, so that it is not necessary to consider a distribution matter. Thus, each of the plurality of peripheral circuit units 131, 132, and 133 may be easily formed above or below each of the plurality of memory units 121, 122, and 123.

Figure 3:
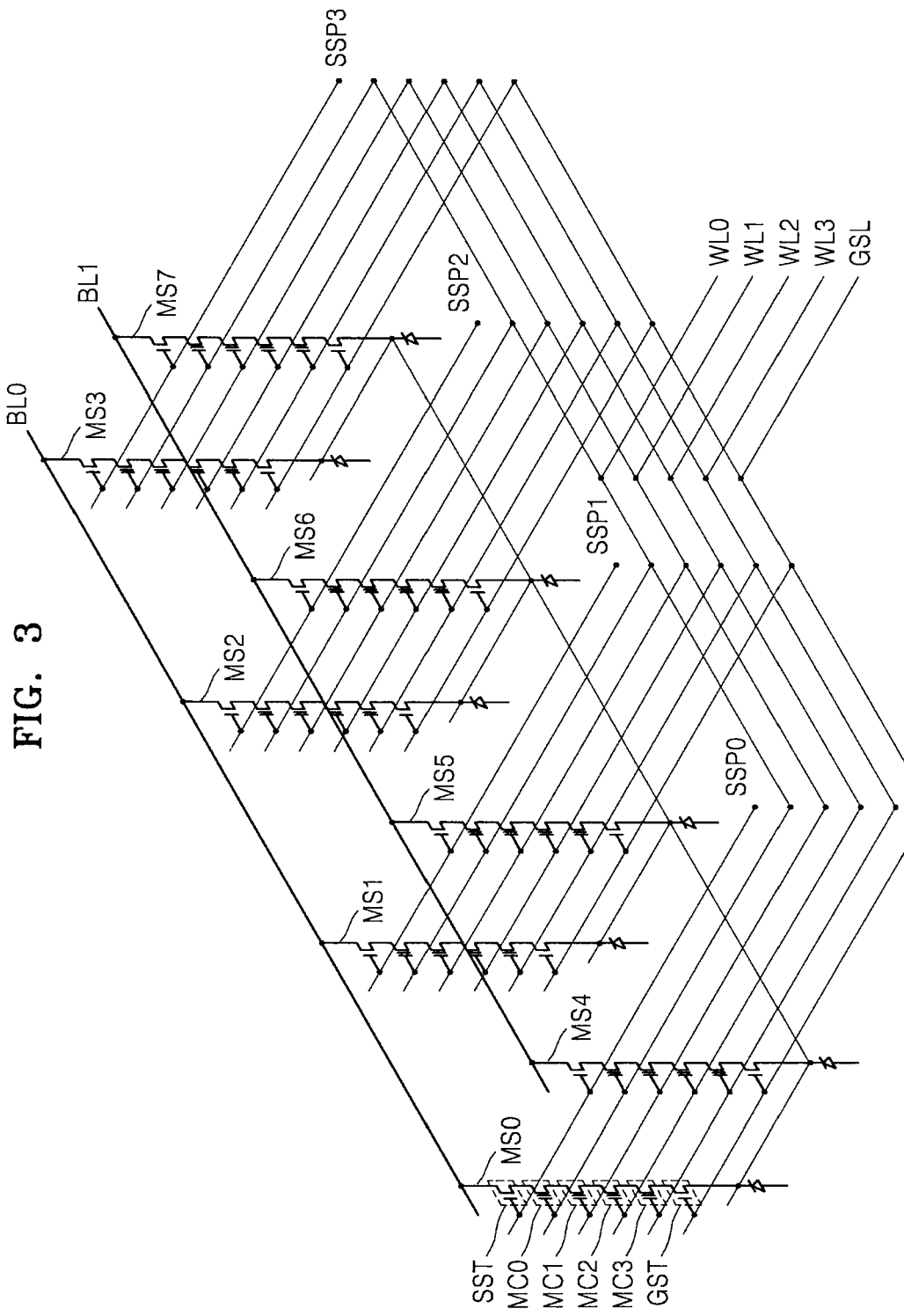
FIG. 3 is a circuit diagram of a portion of a memory unit of FIG. 2.

FIG. 3 is a circuit diagram of a portion of the memory unit 121 of FIG. 2.

Referring to FIG. 3, the memory unit 121 may include a plurality of memory strings MS0 through MS7, and the plurality of memory strings MS0 through MS7 may be matrix-arrayed. Here, the plurality of memory strings MS0 through MS7 may form a memory string array. Although the memory unit 121 illustrated in FIG. 3 includes eight memory strings MS0 through MS7, the number of memory strings that may be included in the memory unit 131 is not limited thereto.

One end of each of the memory strings MS0 through MS7 may be connected to first and second bit lines BL0 and BL1, and the other end of each of the memory strings MS0 through MS7 may be connected to a common source line CSL (not shown). Also, each of the memory strings MS0 through MS7 may include a plurality of memory cells MC0 through MC3, a string selection transistor SST, and a ground selection transistor GST. In example embodiments, the plurality of memory cells MC0 through MC3 may each be a flash memory, and each of the memory strings MS0 through MS7 may be a NAND string. In FIG. 3, each of the memory strings MS0 through MS7 includes the four memory cells, namely, the first through fourth memory cells MC0 through MC3, however, the number of memory cells included in each of the memory strings MS0 through MS7 is not limited thereto. For example, each of the memory strings MS0 through MS7 may include 16 memory cells. In example embodiments, each of the memory strings MS0 through MS7 may include two serially-connected string selection transistors and/or two serially-connected ground selection transistors.

The memory strings that are arrayed in the same column from among the memory strings MS0 through MS7 may be commonly connected to the same bit line. In more detail, the memory strings MS0 through MS3 may be commonly connected to the first bit line BL0, and the memory strings MS4 through MS7 may be commonly connected to the second bit line BL1.

The memory cells that are arrayed in the same row from among the memory strings MS0 through MS7 may be commonly connected to the same word line. In more detail, the first memory cells MC0 from among the memory strings MS0 through MS7 may be commonly connected to a first word line WL0, the second memory cells MC1 may be commonly connected to a second word line WL1, the third memory cells MC2 may be commonly connected to a third word line WL2, and the fourth memory cells MC3 may be commonly connected to a fourth word line WL3. By doing so, when the first through fourth word lines WL0 through WL3 are driven, it is possible to program, read, and erase data with respect to the first through fourth memory cells MC0 through MC3 included in each of the memory strings MS0 through MS7.

The string selection transistors SST that are arrayed in the same row from among the memory strings MS0 through MS7 may be commonly connected to the same string selection pad. In more detail, the string selection transistors SST included in the memory strings MS0 and MS4 may be commonly connected to a first string selection pad SSP0, the string selection transistors SST included in the memory strings MS1 and MS5 may be commonly connected to a second string selection pad SSP1, the string selection transistors SST included in the memory strings MS2 and MS6 may be commonly connected to a third string selection pad SSP2, and the string selection transistors SST included in the memory strings MS3 and MS7 may be commonly connected to a fourth string selection pad SSP3. For example, when a signal applied to the first string selection pad SSP0 is activated, the string selection transistors SST included in the memory strings MS0 and MS4 are turned on. By doing so, it is possible to control data transmission between the first and second bit lines BL0 and BL1 and the first through fourth memory cells MC0 through MC3 that are included in each of the memory strings MS0 through MS7.

The ground selection transistors GST that are included in each of the memory strings MS0 through MS7 may be commonly connected to the same ground selection line GSL. Thus, when a signal applied to the ground selection line GSL is activated, the ground selection transistors GST are turned on, so that the memory strings MS0 through MS7 may be connected to the common source line CSL. By doing so, it is possible to control data transmission between the common source line CSL and the first through fourth memory cells MC0 through MC3 that are included in each of the memory strings MS0 through MS7.

Hereinafter, operations of a memory unit will be described. First, in a program operation, e.g., in order to perform a program operation on the first memory cell MC0 included in the first memory string MS0, 0V may be applied to the first bit line BL0, an ON voltage may be applied to the string selection pad SSP0, and an OFF voltage may be applied to the ground selection line GSL. By applying a program voltage to the first word line WL0 and applying a pass voltage to the first through fourth word lines WL1 through WL3, the program voltage may be applied to the first memory cell MC0 selected from the memory cells MC0 through MC3, and the pass voltage may be applied to the rest of the memory cells MC0 through MC3. Here, a charge may be inserted into the first memory cell MC0 due to Fowler-Nordheim (F-N) tunneling by the program voltage. Here, the ON voltage may be equal to or greater than a threshold voltage of the string selection transistor SST, the OFF voltage may be less than a threshold voltage of the ground selection transistor GST, and the pass voltage may be greater than a threshold voltage of the memory cells MC0 through MC3.

Next, in a read operation, e.g., in order to perform a read operation on the first memory cell MC0 included in the first memory string MS0, a read voltage may be applied to the first bit line BL0, and an ON voltage may be applied to the string selection pad SSP0 and the ground selection line GSL. A reference voltage may be applied to the first memory cell MC0 selected from the memory cells MC0 through MC3, and a pass voltage may be applied to the rest of the memory cells MC0 through MC3.

Next, in an erase operation, e.g., in order to perform an erase operation on the first through fourth memory cells MC0 through MC3 included in the first memory string MS0, an erase voltage may be applied to a body of the first through fourth memory cells MC0 through MC3, and 0V may be applied to the first through fourth word lines WL0 through WL3. By doing so, data of the first through fourth memory cells MC0 through MC3 may be simultaneously erased.

Figure 4:
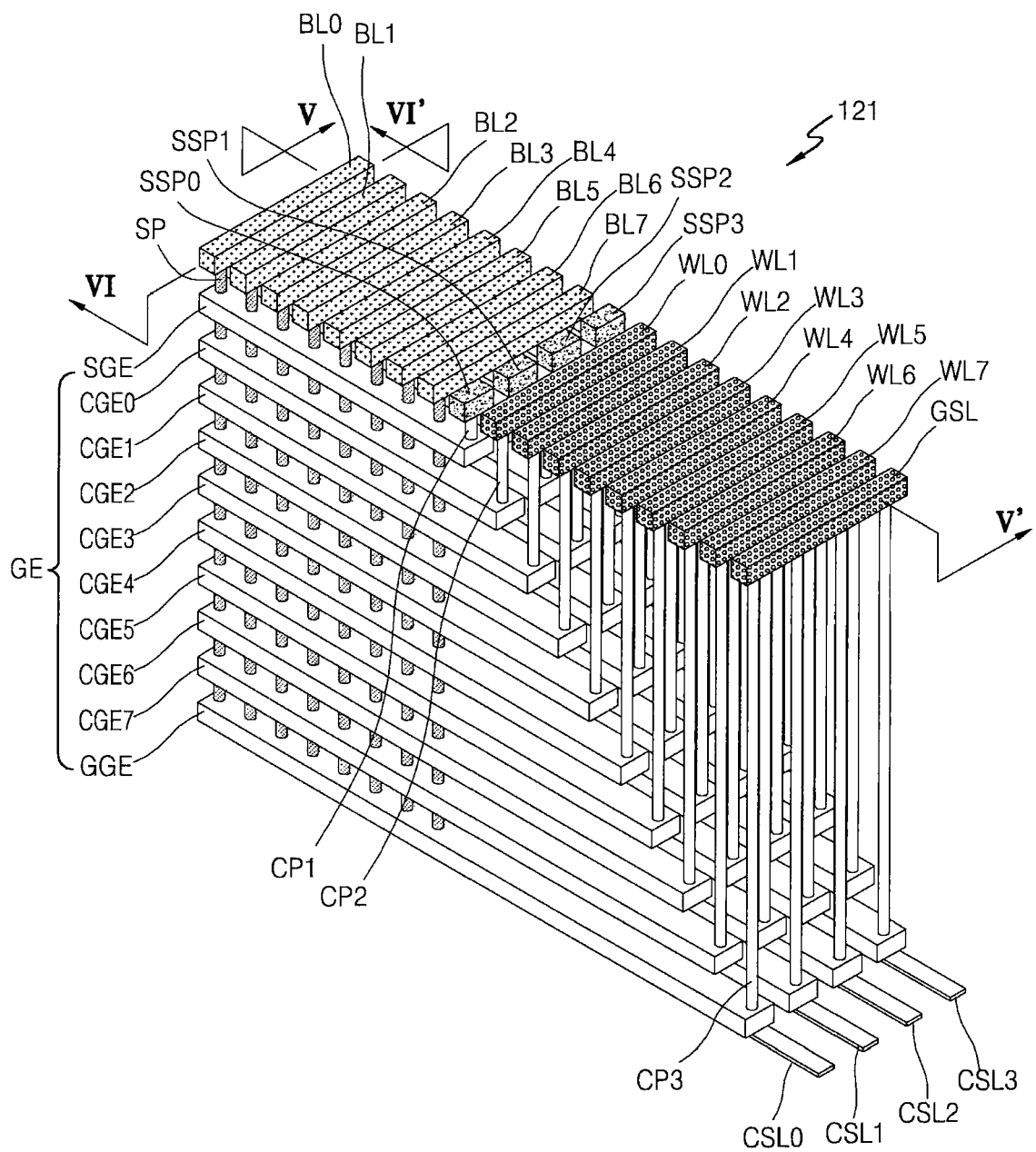
FIG. 4 is a perspective view of the memory unit of FIG. 2.
Figure 5:
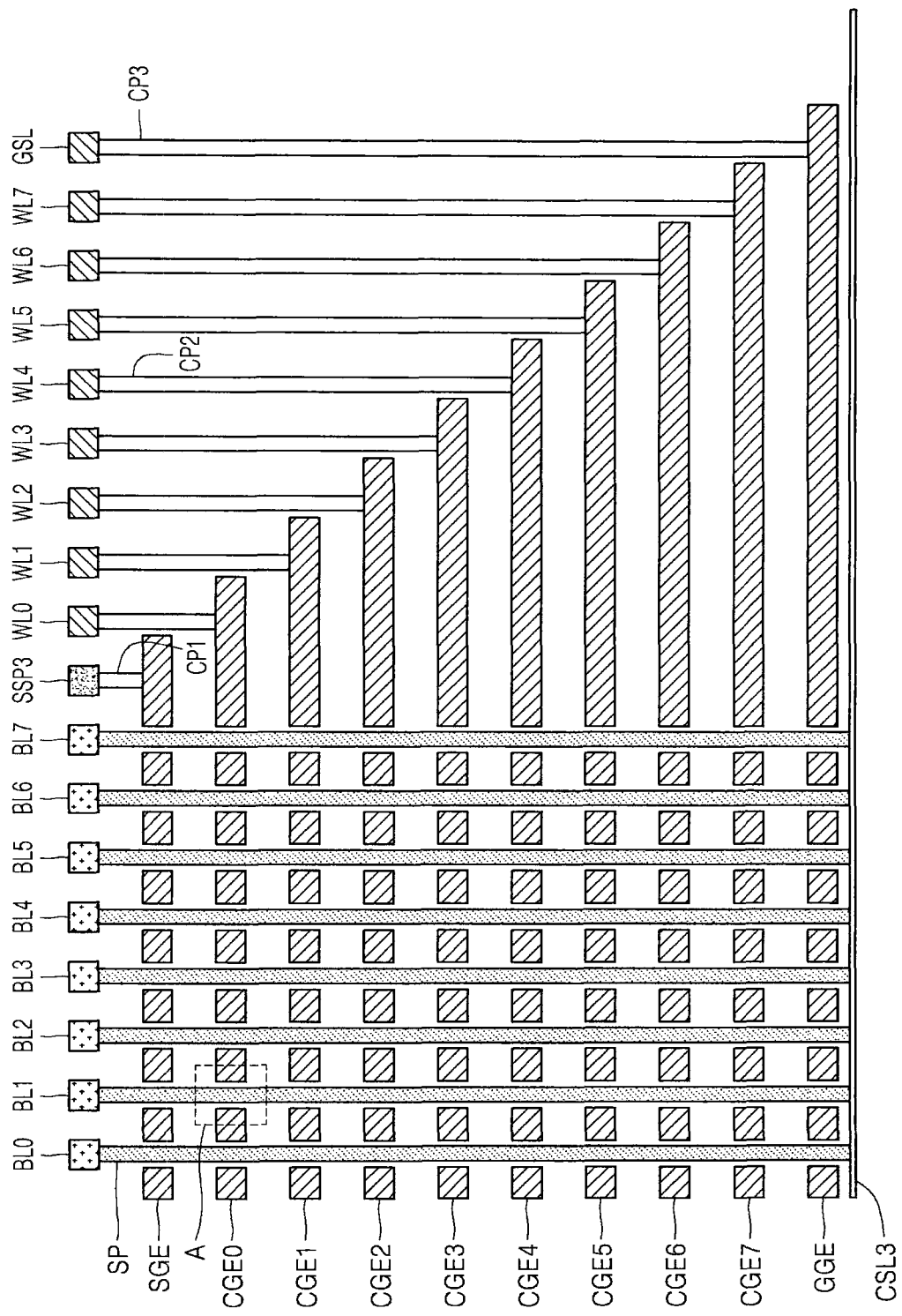
FIG. 5 is a cross-sectional view of the memory unit of FIG. 4, taken along a line V-V'.
Figure 6:
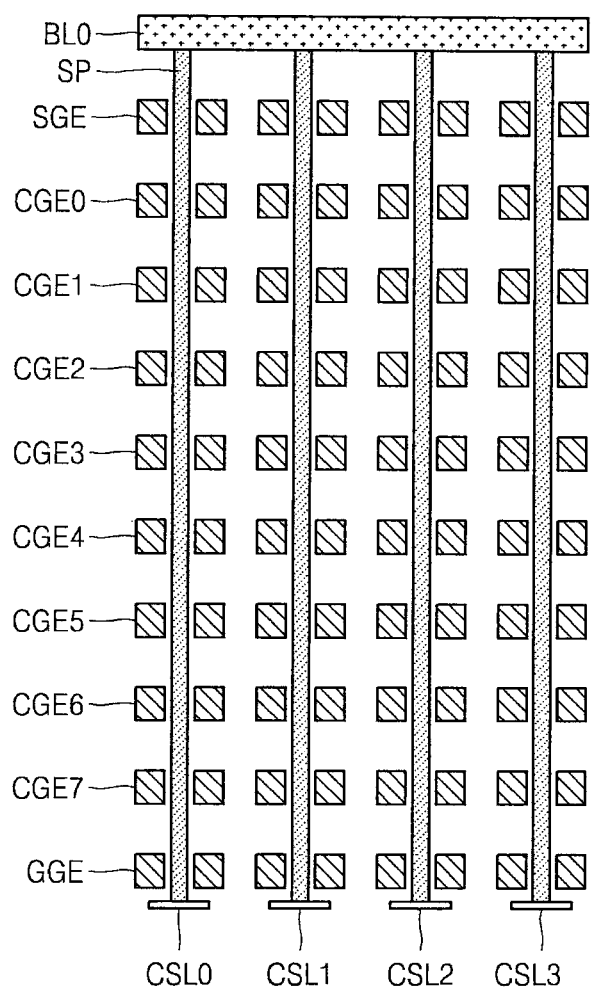
FIG. 6 is a cross-sectional view of the memory unit of FIG. 4, taken along a line VI-VI'.

FIG. 4 is a perspective view of the memory unit 121 of FIG. 2. FIG. 5 is a cross-sectional view of the memory unit 121 of FIG. 4, taken along a line V-V. FIG. 6 is a cross-sectional view of the memory unit 121 of FIG. 4, taken along a line VI-VI'.

Referring to FIGS. 4 through 6, the memory unit 121 may include a plurality of semiconductor pillars SP, a plurality of gate electrodes GE, a plurality of bit lines BL0 through BL7, a plurality of word lines WL0 through WL7, a ground selection line GSL, a plurality of string selection pads SSP0 through SSP3, and a plurality of common source lines CSL0 through CSL3. The memory units 122 and 123 included in the memory device 100 of FIG. 2 may substantially have the same structure as the memory unit 121.

A plurality of storage mediums (not shown) may be formed at side walls of the semiconductor pillars SP, and each storage medium may include a tunneling insulating layer, a charge storage layer, and a blocking insulating layer that are sequentially formed. The storage mediums will be described later with reference to FIG. 8. In this manner, the semiconductor pillars SP, the storage mediums, and the gate electrodes GE may form a memory string array. As described above, each memory string included in the memory string array may include a string selection transistor, memory cells, and a ground selection transistor.

The semiconductor pillars SP may be vertically formed and matrix-arrayed on a substrate (not shown). Although not illustrated in FIG. 4, the substrate may include impurity regions (not shown) below the semiconductor pillars SP, and the impurity regions may correspond to source regions. The impurity regions may be connected to the common source lines CSL0 through CSL3.

The gate electrodes GE may be stacked on the substrate in a direction parallel to the substrate so as to cross the semiconductor pillars SP, and may extend in a first direction. By doing so, the semiconductor pillars SP, which may be arrayed on the same row, may cross the same gate electrode GE on the same layer. However, the semiconductor pillars SP, which are arrayed on different rows, may cross different gate electrodes GE on the same layer. Although not illustrated in FIG. 4, the memory unit 121 may further include a plurality of interlayer insulating layers that are alternately stacked with the gate electrodes GE. The interlayer insulating layers will be described in detail with reference to FIG. 8.

Also, the gate electrodes GE may be a single or composite layer including at least one of polysilicon, aluminium (Al), gold (Au), beryllium (Be), bismuth (Bi), cobalt (Co), hafnium Hf), indium (In), manganese (Mn), molybdenum (Mo), nickel (Ni), lead (Pb), palladium (Pd), plutonium (Pt), rhodium (Rh), rhenium (Re), ruthenium (Ru), tantalum (Ta), tellurium (Te), titanium (Ti), tungsten (W), zinc (Zn), zirconium (Zr), and nitrides or silicides of these.

Also, the gate electrodes GE may include a string selection gate electrode SGE connected to the string selection transistor SST, control gate electrodes CGE0 through CGE7 connected to a plurality of memory cells, respectively, and a ground selection gate electrode GGE connected to the ground selection transistor. In example embodiments, ends of the gate electrodes GE may be step-shaped, and first through third contact plugs CP1, CP2, and CP3 may be formed on the ends of the gate electrodes GE. In more detail, the first contact plug CP1 may be formed on the end of the string selection gate electrode SGE, the second contact plugs CP2 may be formed on the ends of the control gate electrodes CGE0 through CGE7, and the third contact plug CP3 may be formed on the end of the ground selection gate electrode GGE.

The bit lines BL0 through BL7 may be connected to ends of the semiconductor pillars SP, and may extend in a second direction perpendicular to the first direction. By doing so, ends of the semiconductor pillars SP disposed at the same column may be connected to the same bit line, and ends of the semiconductor pillars SP disposed at different columns may be connected to different bit lines, respectively.

The string selection pads SSP0 through SSP3 may be respectively connected to ends of the string selection gate electrodes SGE via the first contact plugs CP1, and may be disposed in a single line along the second direction that is parallel to the bit lines BL0 through BL7. In more detail, the first string selection pad SSP0 may be connected to the string selection gate electrode SGE disposed at a first row, the second string selection pad SSP1 may be connected to the string selection gate electrode SGE disposed at a second row, the third string selection pad SSP2 may be connected to the string selection gate electrode SGE disposed at a third row, and the fourth string selection pad SSP3 may be connected to the string selection gate electrode SGE disposed at a fourth row.

The word lines WL0 through WL7 may be connected to ends of the control gate electrodes CGE0 through CGE7 via the second contact plugs CP2, and may extend in the second direction parallel to the bit lines BL0 through BL7. By doing so, the memory cells disposed in the same layer may be connected to the same word line. For example, the first control gate electrodes CGE0 at the first through fourth rows may be connected to the first word line WL0 via the second contact plugs CP2, and the second control gate electrodes CGE1 at the first through fourth rows may be connected to the second word line WL1 via the second contact plugs CP2. Memory cells included in the same memory string may be connected to different word lines, respectively. For example, the first control gate electrode CGE0 may be connected to the first word line WL0 via the second contact plug CP2, and the second control gate electrode CGE1 may be connected to the second word line WL1 via the second contact plug CP2.

The ground selection line GSL may be connected to the ends of the ground selection gate electrodes GGE via the third contact plugs CP3, and may extend in the second direction that is parallel to the bit lines BL0 through BL7. By doing so, the ground selection transistors may be commonly connected to the ground selection line GSL.

In a memory device according to the related art, a memory unit and a peripheral circuit unit are formed on a substrate. In more detail, the peripheral circuit unit is formed at a side of the memory unit. Thus, in order to connect a string selection transistor, which is included in the memory unit, to a string selection driver or a string selection decoder which is included in the peripheral circuit unit, it is necessary to form a string selection line extending in a direction toward the peripheral circuit unit, for example, in a horizontal direction. Accordingly, it is necessary for the memory unit to have an area in which the string selection line extends. By doing so, there is a limit in improving the integrity of the memory device.

However, in the stacked memory device 100 according to example embodiments, each of the plurality of peripheral circuit units 131, 132, and 133 may be formed above or below each of the plurality of memory units 121, 122, and 123. Thus, e.g., a string selection driver or a string selection decoder may be disposed immediately above the string selection transistor SST that is included in the memory unit 121. Thus, a string selection line may not extend in a direction toward the peripheral circuit unit 131 but may be formed as a string selection pad. By doing so, it is not necessary for the memory unit 121 to have an area in which the string selection line extends, so that the integrity of the stacked memory device 100 may be significantly improved. Also, since the peripheral circuit unit 131 may be disposed immediately above the memory unit 121, the complexity of wiring may be significantly decreased.

Figure 7:
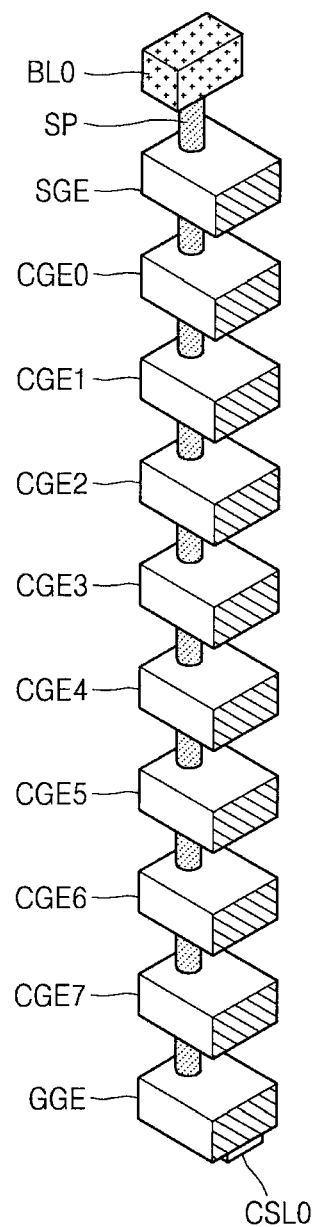
FIG. 7 is a perspective view of an example of a memory string included in the memory unit of FIG. 4.

FIG. 7 is a perspective view of an example of a memory string included in the memory unit 121 of FIG. 4.

Referring to FIG. 7, an end of a semiconductor pillar SP may be connected to a bit line BL0, the other end of the semiconductor pillar SP may be connected to a common source line CSL0. The semiconductor pillar SP may penetrate a string selection gate electrode SGE, control gate electrodes CGE0 through CGE7, and a ground selection gate electrode GGE. Here, the semiconductor pillar SP may extend in a direction perpendicular to a substrate, the string selection gate electrode SGE, the control gate electrodes CGE0 through CGE7, the ground selection gate electrode GGE, and a common source line CSL0 may extend in the first direction parallel to the substrate, and the bit line BL0 may extend in a second direction perpendicular to the first direction.

In example embodiments, the semiconductor pillar SP may have a cylindrical shape. However, the shape of the semiconductor pillar SP is not limited thereto, and thus may have other shapes, for example, a polygonal shape including a triangular shape or a quadrangle shape.

Figure 8:
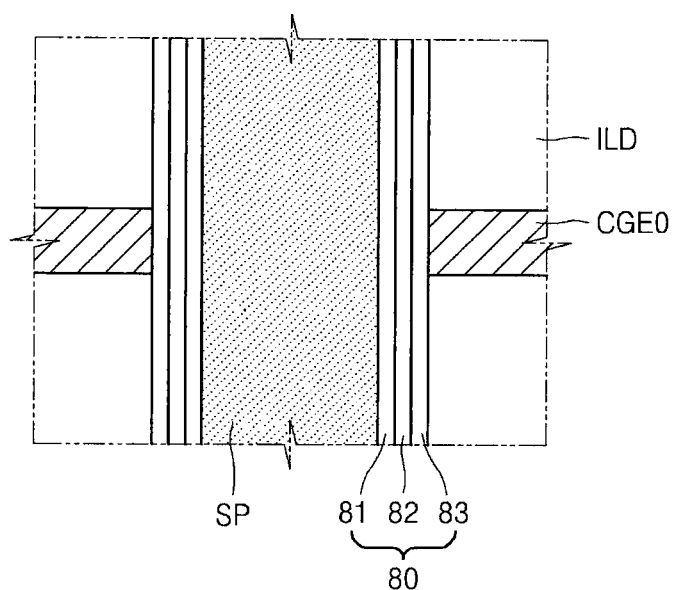
FIG. 8 is a cross-sectional view of an area A indicated in FIG. 5.

FIG. 8 is a cross-sectional view of an area A indicated in FIG. 5.

Referring to FIG. 8, a control gate electrode CGE0 and an interlayer insulating layer ILD may be alternately formed at a sidewall of a semiconductor pillar SP, and a storage medium 80 may be formed between the semiconductor pillar SP and the control gate electrode CGE0. The storage medium 80 may include a tunneling insulating layer 81, a charge storage layer 82, and a blocking insulating layer 83. In example embodiments, the tunneling insulating layer 81 may be formed to surround the sidewall of the semiconductor pillar SP, the charge storage layer 82 may be formed to surround a sidewall of the tunneling insulating layer 81, and the blocking insulating layer 83 may be formed to surround a sidewall of the charge storage layer 82.

In example embodiments, the tunneling insulating layer 81 may be a single or composite layer including at least one material of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$). For example, the tunneling insulating layer 81 may be formed by using chemical vapor deposition (CVD).

The charge storage layer 82 may be a charge trap layer or a floating gate. In the case where the charge storage layer 82 is the charge trap layer, the charge trap layer may be a single or composite layer including at least one material of silicon oxide ($SiO_2$), silicon nitride (Si3N4), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride (AlGaN). In the case where the charge storage layer 82 is the floating gate, the floating gate may be formed by depositing polysilicon via CVD, for example, low-pressure chemical vapor deposition (LPCVD) using $SiH_4$ or $Si_2H_6$ and $PH_3$ gas.

The blocking insulating layer 83 may be a single layer including at least one material of silicon oxide ($SiO_2$), silicon nitride ($Si_3N_4$), silicon oxynitride (SiON), and a high-k dielectric layer, or a composite layer in which respective layers include at least one oxide selected from those materials. In example embodiments, the high-k dielectric layer may be a single layer including at least one oxide of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlO), lanthanum hafnium oxide (LaHfO), hafnium aluminum oxide (HfAlO), and praseodymium oxide ($Pr_2O_3$). For example, the blocking insulating layer 83 may be formed by using CVD.

Figure 9:
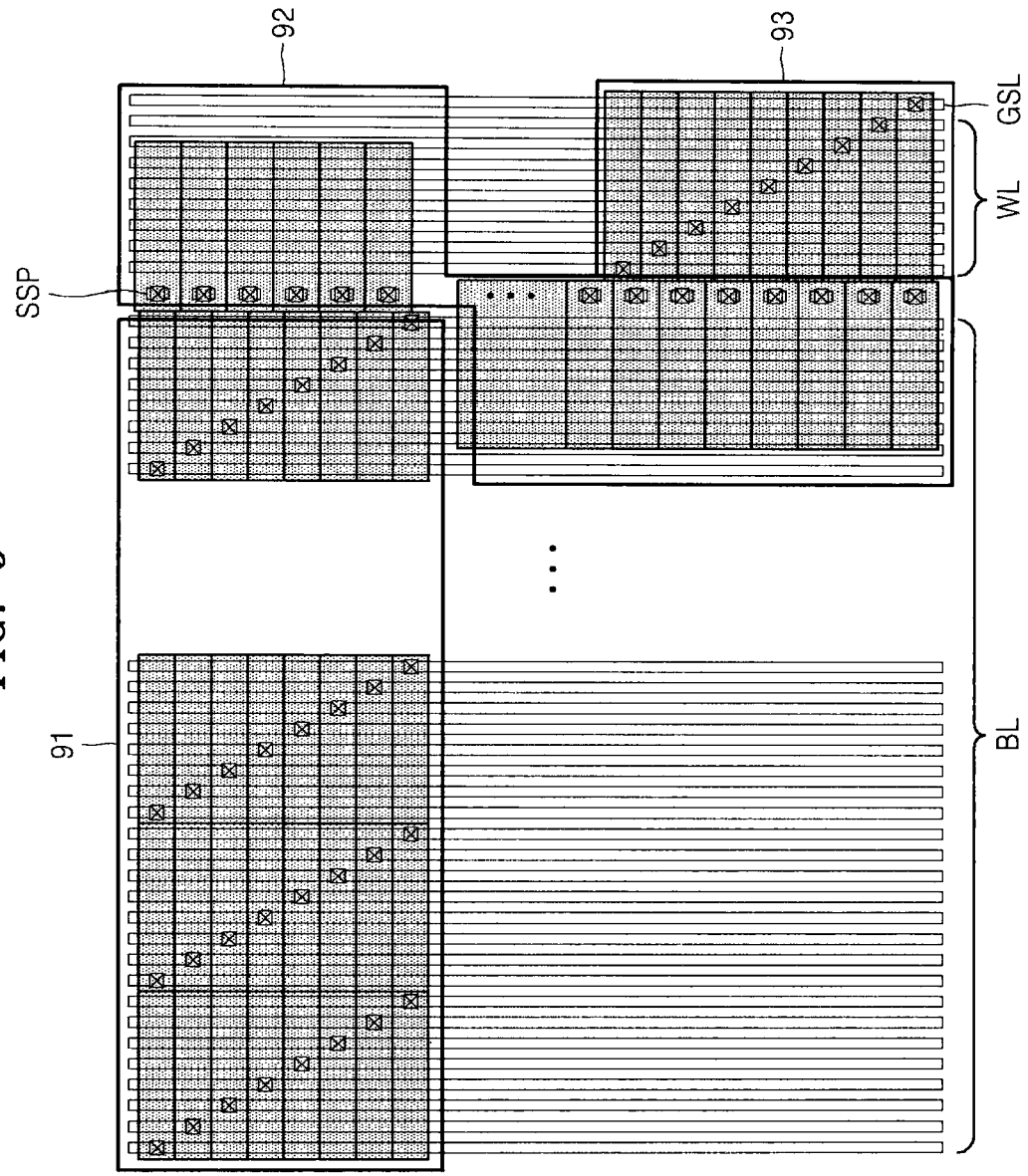
FIG. 9 is a diagram of an example layout of a peripheral circuit unit of FIG. 2.

FIG. 9 is a diagram of a layout of one of the peripheral circuit units 131, 132, and 133 of FIG. 2.

Referring to FIG. 9, a first circuit unit 91 may be disposed above bit lines BL. For example, the first circuit unit 91 may be the column decoder 23, the data I/O circuit 24, or the page buffer 25 which are illustrated in FIG. 1. In example embodiments, the first circuit unit 91 may include a plurality of circuit devices, and the respective circuit devices may be connected to the bit lines BL via contact plugs. For example, the circuit devices may include transistors.

A second circuit unit 92 may be disposed above string selection pads SSP. For example, the second circuit unit 92 may be a string selection pad driver or a string selection pad decoder, which may be a portion of the row decoder 22 illustrated in FIG. 1. In example embodiments, the second circuit unit 92 may include a plurality of circuit devices, and the respective circuit devices may be connected to the string selection pads SSP via contact plugs. For example, the circuit devices may include transistors.

A third circuit unit 93 may be disposed above word lines WL and a ground selection line GSL. For example, the third circuit unit 93 may be a word line driver, a word line decoder, a ground selection line driver, or a ground selection line decoder, which may be a portion of the row decoder 22 illustrated in FIG. 1. In example embodiments, the third circuit unit 93 may include a plurality of circuit devices, and the respective circuit devices may be connected to the word lines WL and the ground selection line GSL via contact plugs. For example, the circuit devices may include transistors.

FIGS. 10A through 10G are schematic cross-sectional views for describing a method of manufacturing a stacked memory device, according to example embodiments.

Figure 10A:
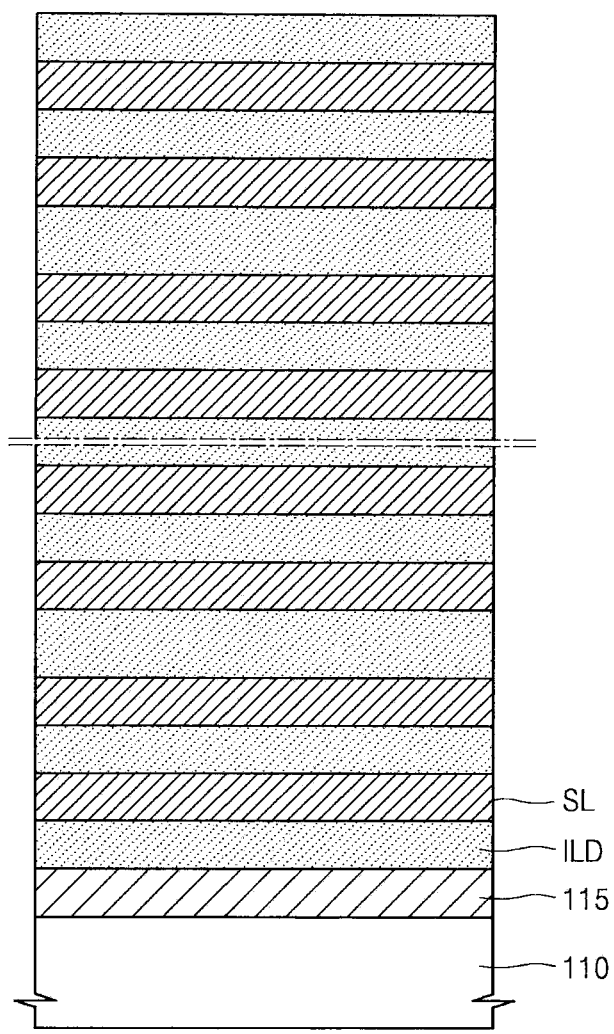
FIGS. 10A through 10G are schematic cross-sectional views for describing a method of manufacturing a stacked memory device, according to example embodiments.

Referring to FIG. 10A, an impurity region 115 may be formed by injecting impurities into an upper portion of a substrate 110. In example embodiments, an interlayer insulating layers ILD and sacrificial layers SL may be alternately stacked on the substrate 110. In example embodiments, the sacrificial layers SL may have an etch selectivity to the interlayer insulating layers ILD. For example, the interlayer insulating layers ILD may be an oxide, and the sacrificial layers SL may be a nitride.

Figure 10B:
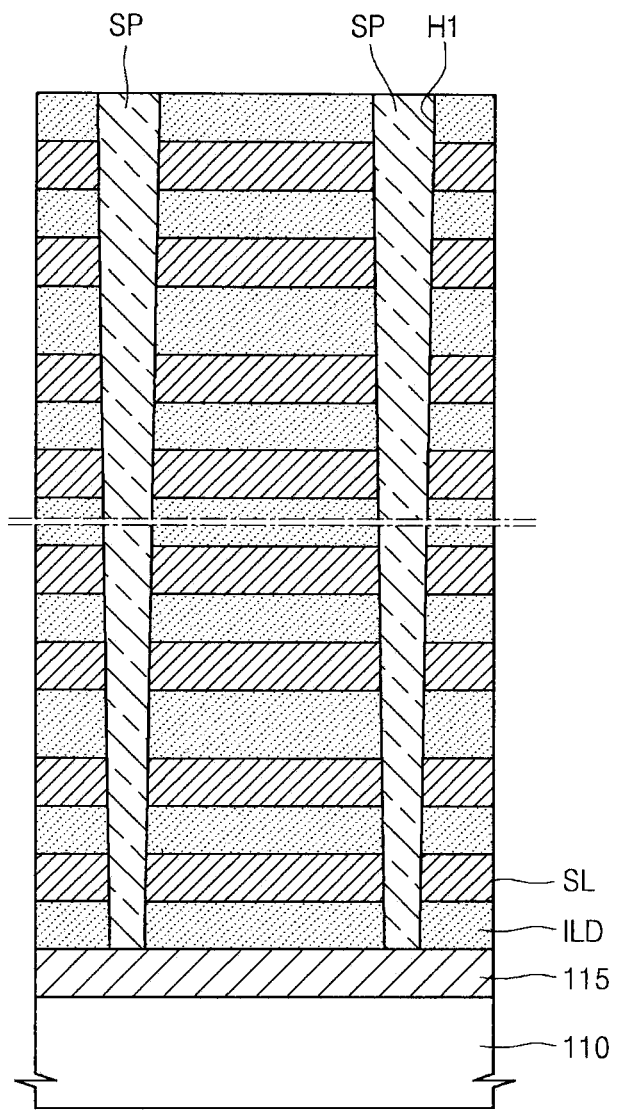

Referring to FIG. 10B, a plurality of first holes H1 may be formed by etching the interlayer insulating layers ILD and the sacrificial layers SL. In example embodiments, the first holes H1 may be formed by using photolithography and etching techniques. In example embodiments, semiconductor pillars SP may be formed by filling the first holes H1. For example, the semiconductor pillars SP may have a polycrystalline structure, or may be formed as an epitaxial layer having a single crystal structure.

Figure 10C:
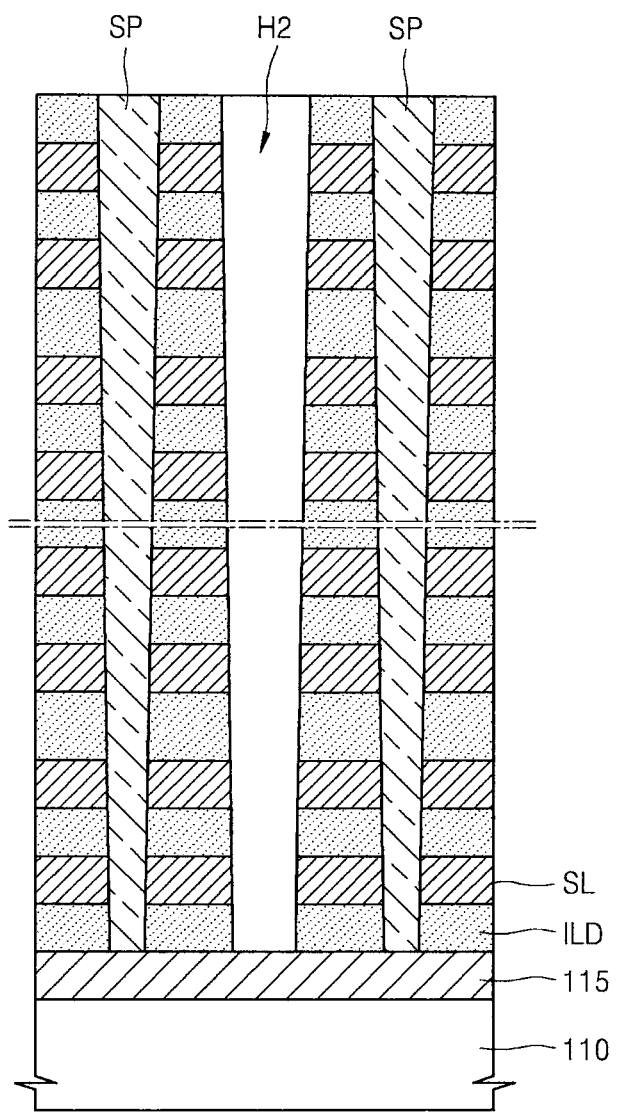

Referring to FIG. 10C, a plurality of second holes H2 may be formed by etching the interlayer insulating layers ILD and the sacrificial layers SL that are between the semiconductor pillars SP. In example embodiments, the second holes H2 may be formed by using photolithography and etching techniques.

Figure 10D:
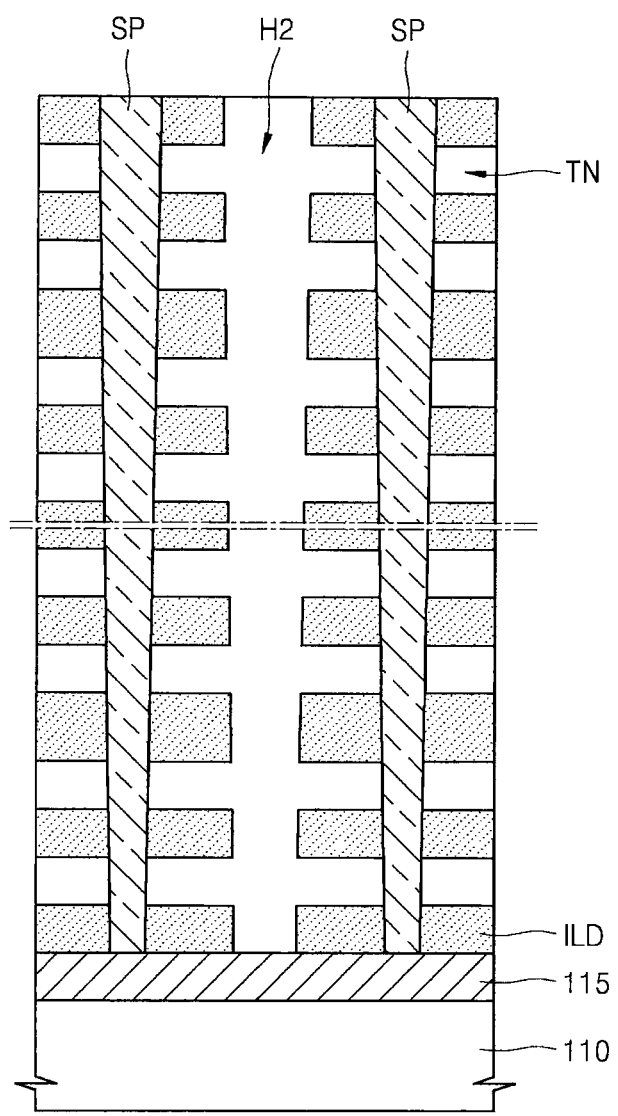

Referring to FIG. 10D, the sacrificial layers SL may be removed. For example, an etchant may be penetrated between the interlayer insulating layers ILD through the second holes H2 by performing isotropic etching. For example, the isotropic etching may include wet etching or chemical dry etching. Accordingly, the sacrificial layers SL between the interlayer insulating layers ILD may be removed so that tunnels TN connected to the second holes H2 may be formed, and sidewalls of the semiconductor pillars SP may be exposed in the tunnels TN.

Figure 10E:
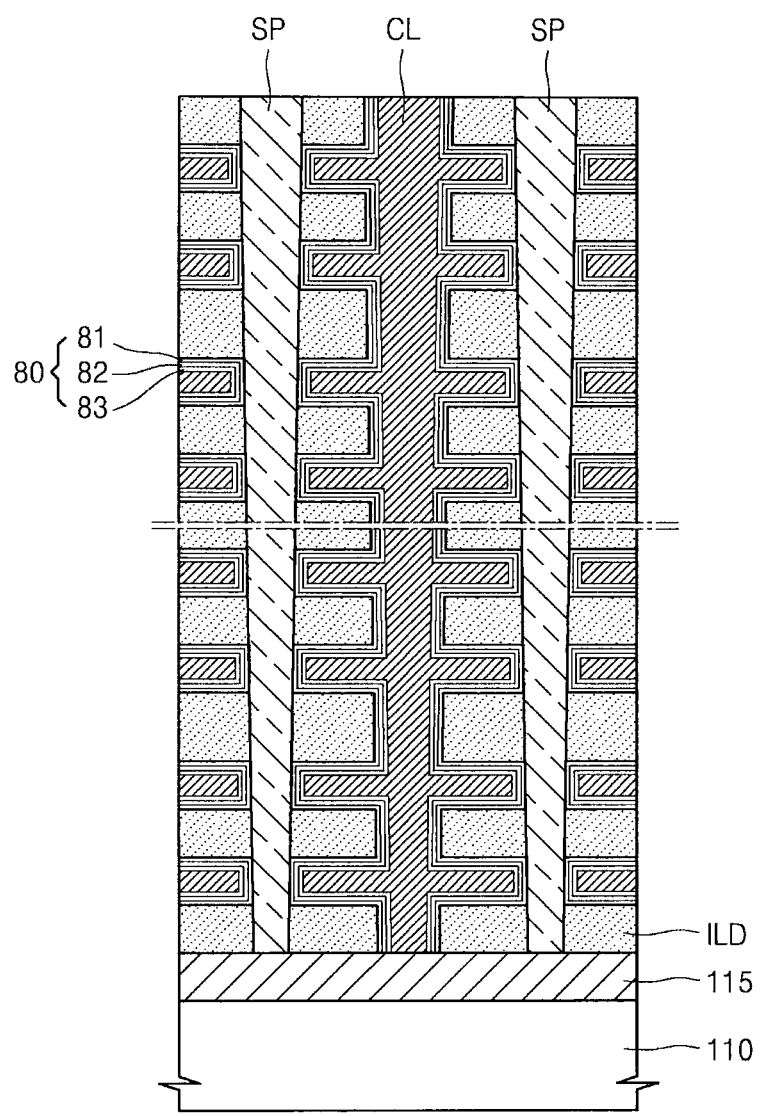

Referring to FIG. 10E, storage mediums 80 may be formed on the interlayer insulating layers ILD and the sidewalls of the semiconductor pillars SP that are exposed in the second holes H2 and the tunnels TN. Each of the storage mediums 80 may include a tunneling insulating layer 81, a charge storage layer 82, and a blocking insulating layer 83 which may be sequentially formed in the stated order on the interlayer insulating layers ILD and the sidewalls of the semiconductor pillars SP which are exposed in the second holes H2 and the tunnels TN. In example embodiments, a conductive layer CL may be formed on the storage mediums 80.

Figure 10F:
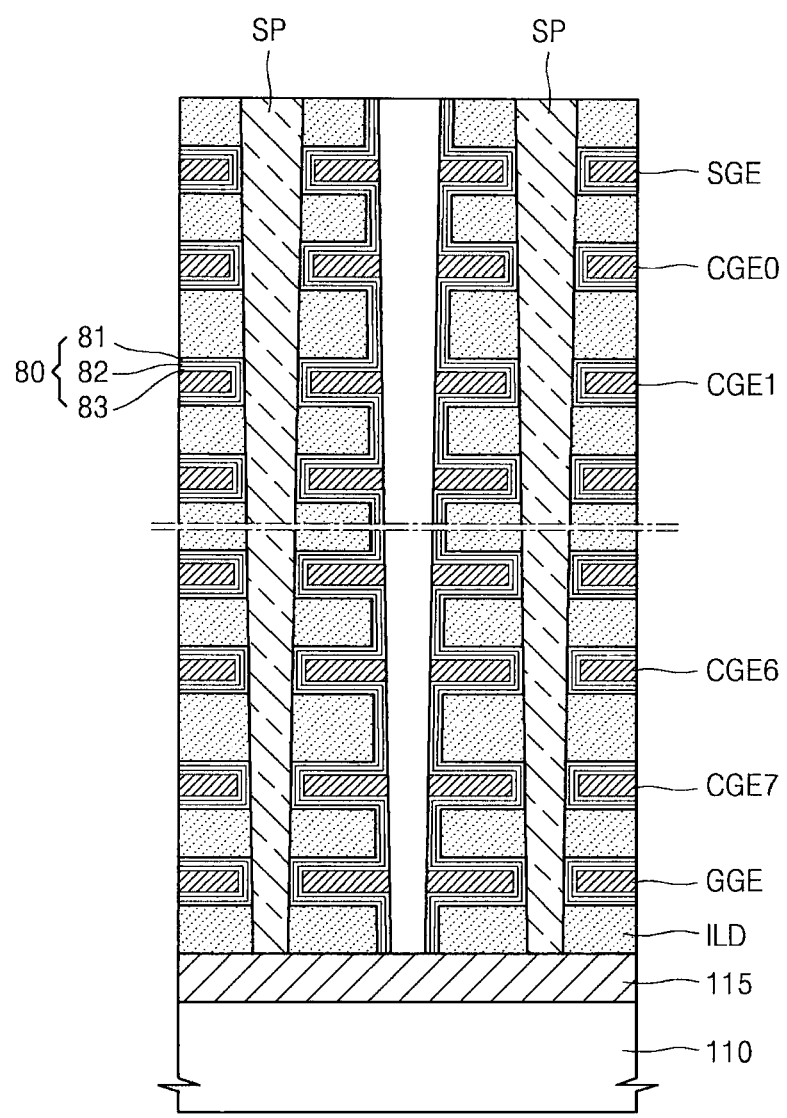

Referring to FIG. 10F, the conductive layer CL exposed by the second holes H2 may be selectively etched so that ground selection gate electrodes GGE, control gate electrodes CGE0 through CGE7, and string selection gate electrodes SGE may be formed. Here, ends of the ground selection gate electrodes GGE, the control gate electrodes CGE0 through CGE7, and the string selection gate electrodes SGE may be step-shaped. In particular, a plurality of mask layers, respectively having different sizes, may be used in order to form the step-shaped ends of the ground selection gate electrodes GGE, the control gate electrodes CGE0 through CGE7, and the string selection gate electrodes SGE.

Figure 10G:
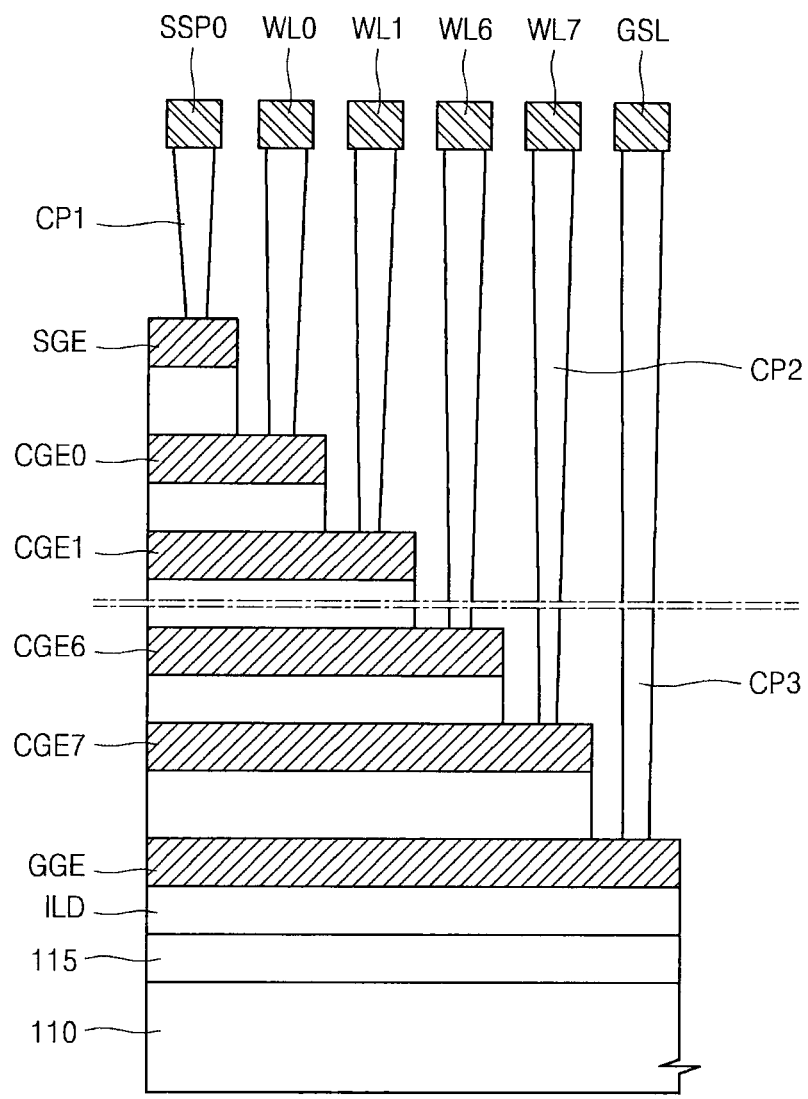

Referring to FIG. 10G, the string selection gate electrode SGE may be connected to a string selection pad SSP0 via a first contact plug CP1. The control gate electrodes CGE0 through CGE7 may be connected to word lines WL0 through WL7 via second contact plugs CP2. The ground selection gate electrode GGE may be connected to a ground selection line GSL via a third contact plug CP3.

Figure 11:
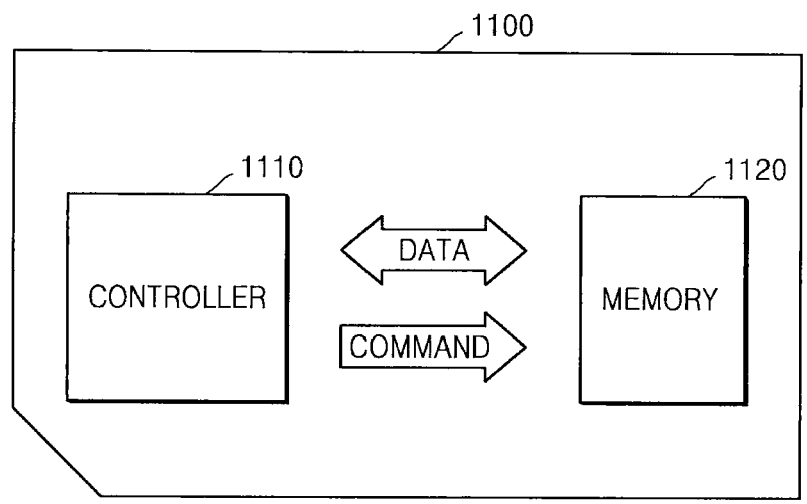
FIG. 11 is a diagram of a memory card according to example embodiments.

FIG. 11 is a diagram of a memory card 1100 according to example embodiments.

Referring to FIG. 11, the memory card 1100 may include a controller 1110 and a memory 1120. In example embodiments, the controller 1110 and the memory 1120 may be disposed to exchange an electrical signal. For example, when the controller 1110 commands, the memory 1120 may transmit data. The memory 1120 may include a stacked memory device according to example embodiments.

Memory devices according to example embodiments may be disposed as "NAND" and "NOR" architecture memory arrays (not shown) according to logic gate designs. A memory array formed of a plurality of rows and columns may form at least one memory array bank (not shown). The memory 1120 may include the memory array (not shown) or the memory array bank (not shown). Also, in order to drive the memory array bank (not shown), the memory card 1100 may further include a row decoder (not shown), a column decoder (not shown), I/O buffers (not shown), and/or a control register (not shown).

The memory card 1100 may be used in various types of memory cards including a memory stick card, a smart media (SM) card, a secure digital (SD) card, a mini SD card, or a multimedia card (MMC).

Figure 12:
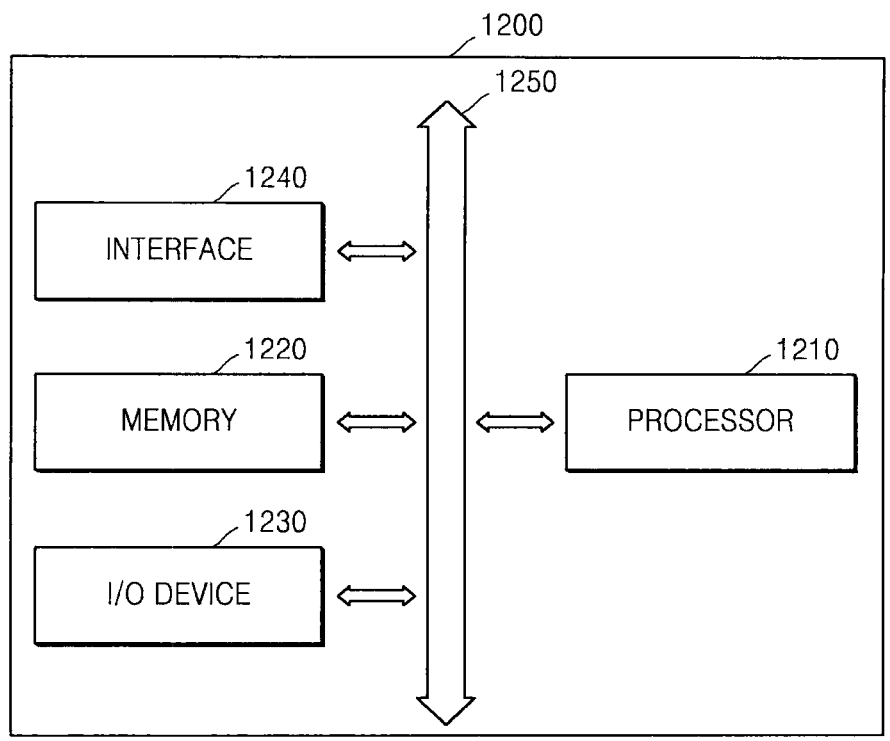
FIG. 12 is a diagram of an electronic system according to example embodiments.

FIG. 12 is a diagram of an electronic system 1200 according to example embodiments.

Referring to FIG. 12, the electronic system 1200 may include a processor 1210, a memory 1220, an I/O device 1230, and an interface 1240. The electronic system 1200 may be a mobile system or a system for transmitting and receiving information. The mobile system may include a Personal Digital Assistant (PDA), a portable computer, a web tablet, a wireless phone, a mobile phone, a digital music player, or a memory card.

The processor 1210 may function to execute a program and to control the electronic system 1200. In example embodiments, the processor 1210 may be a microprocessor, a digital signal processor, a microcontroller, or a device similar to one of these processors.

The I/O device 1230 may be used to input or output data of the electronic system 1200. The electronic system 1200 may be connected to an external device including a personal computer or a network with the I/O device 1230, and the electronic system 1200 may exchange data with the external device. In example embodiments, the I/O device 1230 may include, but is not limited to, a keypad, a keyboard, or a display.

The memory 1220 may store codes and/or data for operations of the processor 1210, or store data processed in the processor 1210. In example embodiments, the memory 1220 may include a stacked memory device according to example embodiments.

The interface 1240 may be a data transmission path between the electronic system 1200 and the external device. The processor 1210, the memory 1220, the I/O device 1230, and the interface 1240 may communicate with each other via a bus 1250.

For example, the electronic system 1200 may be used in a mobile phone, an MPEG Audio Layer-3 (MP3) player, navigation, a portable multimedia player (PMP), a solid state disk (SSD), or household appliances.

In accordance with example embodiments, the stacked memory device may include the peripheral circuit units above or below the memory units, so that an active circuit including the string selection driver or the string selection decoder may be disposed immediately above the string selection transistor that is included in the memory unit. By doing so, the string selection line may not extend in a direction toward the peripheral circuit units but may be formed as the string selection pad. Thus, it is not necessary for the memory unit to have the area in which the string selection line extends, so that the integrity of the stacked memory device may be significantly improved.

In addition, since the peripheral circuit unit may be formed immediately above or below the memory unit, the complexity of a line connection between the memory unit and the peripheral circuit unit may be significantly decreased. Furthermore, the lengths of lines between the memory unit and the peripheral circuit unit may be reduced, so that a signal delay may be decreased.

In addition, the stacked memory device may include the plurality of memory units and the plurality of peripheral circuit units that are alternately disposed with the plurality of memory units, so that a large amount of data may be stored in a limited area.

It should be understood that example embodiments described herein should be considered in a descriptive sense only and not for purposes of limitation. Descriptions of features or aspects within example embodiments should typically be considered as available for other similar features or aspects in other embodiments.

What is claimed is:

1. A stacked memory device comprising:
   at least one memory unit; and
   at least one peripheral circuit unit arranged at least one of above and below the at least one memory unit,
   wherein the at least one memory unit includes
      a memory string array, the memory string array including a plurality of memory strings arranged in a matrix, each of the memory strings including a plurality of memory cells and a string selection device arranged perpendicular to a substrate,
      a plurality of bit lines, the plurality of bit lines extending in a first direction and connected to ends of the plurality of memory strings; and
      a plurality of string selection pads, the plurality of string selection pads being arrayed in a single line along the first direction and connected to the string selection devices included in the plurality of memory strings.

2. The stacked memory device of claim 1, wherein
   the string selection devices are spaced apart in the first direction and a second direction that is perpendicular to the first direction and the string selection devices adjacent to one another in the first direction are connected to different string selection pads of the plurality of string selection pads and the string selection devices adjacent to one another in the second direction are commonly connected to one of the plurality of string selection pads.

3. The stacked memory device of claim 1, wherein
   ends of the memory strings of the memory string array that are adjacent to one another in the first direction are commonly connected to one of the plurality of bit lines, and
   ends of the memory strings of the memory string array that are adjacent to one another in a second direction perpendicular to the first direction are connected to different bit lines from among the plurality of bit lines.

4. The stacked memory device of claim 1, wherein the at least one memory unit further includes a plurality of word lines connected to the plurality of memory cells, the plurality of word lines extending in the first direction.

5. The stacked memory device of claim 4, wherein the memory string array further includes
   a plurality of semiconductor pillars perpendicular to the substrate,
   a plurality of storage mediums on sidewalls of the plurality of semiconductor pillars, and
   a plurality of gate electrodes above the substrate extending in a direction parallel to the substrate so as to cross the plurality of semiconductor pillars, and further extending in a second direction perpendicular to the first direction.

6. The stacked memory device of claim 5, wherein the plurality of gate electrodes includes
   string selection gate electrodes connected to the string selection devices included in the plurality of memory strings; and
   control gate electrodes connected to the plurality of memory cells included in the plurality of memory strings.

7. The stacked memory device of claim 6, wherein the at least one memory unit further includes
   a plurality of first contact plugs on ends of the string selection gate electrodes, the plurality of first contact plugs connecting the plurality of string selection pads to the string selection gate electrodes, and
   a plurality of second contact plugs on ends of the control gate electrodes, the plurality of second contact plugs connecting the plurality of word lines to the control gate electrodes.

8. The stacked memory device of claim 6, wherein
   the control gate electrodes include control gate electrodes at a same level and control gate electrodes at different levels, the control gate electrodes at the same level being commonly connected to one of the plurality of word lines and the control gate electrodes at the different levels being connected to different word lines from among the plurality of word lines.

9. The stacked memory device of claim 6, wherein
   each of the memory strings further includes a ground selection device, and
   the plurality of gate electrodes further includes ground selection gate electrodes connected to the ground selection devices.

10. The stacked memory device of claim 9, wherein the at least one memory unit further includes a ground selection line connected to the ground selection devices, the ground selection line extending in the first direction.

11. The stacked memory device of claim 10, wherein the at least one memory unit further includes a plurality of third contact plugs on ends of the ground selection gate electrodes, and the plurality of third contact plugs connects the ground selection line to the ground selection gate electrodes.

12. The stacked memory device of claim 10, wherein the at least one memory unit further includes a common source line between the substrate and the plurality of memory strings, the common source line being connected to the plurality of memory strings and extending in the second direction.

13. The stacked memory device of claim 9, wherein ends of the plurality of gate electrodes are step-shaped.

14. The stacked memory device of claim 1, wherein the plurality of memory strings include a plurality of NAND flash memory strings, and the plurality of memory cells include a plurality of NAND flash memory cells.

15. The stacked memory device of claim 4, wherein the at least one peripheral circuit unit includes at least one of
   a first circuit unit above a portion of the plurality of bit lines,
   a second circuit unit above a portion of the plurality of string selection pads, and
   a third circuit unit above a portion of the plurality of word lines.

16. The stacked memory device of claim 15, wherein
   the first circuit unit includes at least one of a column decoder, a write driver, a sense amplifier, and a page buffer,
   the second circuit unit includes at least one of a string selection driver and a string selection decoder, and
   the third circuit unit includes at least one of a row driver and a row decoder.

17. The stacked memory device of claim 1, wherein
   the at least one memory unit includes a plurality of memory units stacked on the substrate, and
   the at least one peripheral circuit unit includes a plurality of peripheral circuit units alternately stacked with the plurality of memory units.

18. A method of manufacturing a stacked memory device, the method comprising:
   forming a plurality of string selection gate electrodes and a plurality of control gate electrodes extending in a first direction on a substrate;
   forming a plurality of semiconductor pillars penetrating the plurality of string selection gate electrodes and the plurality of control gate electrodes;
   forming a plurality of bit lines connected to ends of the plurality of semiconductor pillars and extending in a second direction perpendicular to the first direction;
   forming a plurality of string selection pads in a single line along the second direction, the plurality of string selection pads being connected to ends of the plurality of string selection gate electrodes; and
   forming peripheral circuit devices above a portion of the plurality of bit lines and the plurality of string selection pads.

19. The method of claim 18, further comprising:
   forming a plurality of word lines connected to ends of the plurality of control gate electrodes, and extending in the second direction.

20. The method of claim 18, further comprising:
   forming storage mediums at sidewalls of the plurality of semiconductor pillars.

* * * * *